United States Patent [19]

Henry

[11] 4,105,942
[45] Aug. 8, 1978

[54] DIFFERENTIAL AMPLIFIER CIRCUIT HAVING COMMON MODE COMPENSATION

[75] Inventor: Paul Michael Henry, Chandler, Ariz.

[73] Assignee: Motorola, Inc., Schaumburg, Ill.

[21] Appl. No.: 750,477

[22] Filed: Dec. 14, 1976

[51] Int. Cl.² .............................................. H03F 3/45
[52] U.S. Cl. ..................................... 330/261; 330/69; 330/258; 330/297
[58] Field of Search ................. 330/69, 258, 261, 297, 330/30 D

[56] References Cited

U.S. PATENT DOCUMENTS

| | | | |
|---|---|---|---|
| 3,582,802 | 6/1971 | Weekes | 330/258 |
| 3,622,902 | 11/1971 | Thomas | 330/30 D |
| 3,845,404 | 10/1974 | Trilling | 330/30 D X |

Primary Examiner—Lawrence J. Dahl
Attorney, Agent, or Firm—Joe E. Barbee

[57] ABSTRACT

A differential amplifier having output common mode offset voltage compensation. Means for sensing output common mode offset voltage are coupled to the differential amplifier. Means for amplifying any common mode offset voltage sensed are coupled to means for controlling voltage to the differential amplifier so that the voltage to the differential amplifier can be adjusted either up or down as required, thereby changing the common mode offset voltage to a predetermined level.

10 Claims, 1 Drawing Figure

DIFFERENTIAL AMPLIFIER CIRCUIT HAVING COMMON MODE COMPENSATION

BACKGROUND OF THE INVENTION

This invention relates generally to electronic differential amplifiers and, more particularly, to a differential amplifier having output common mode offset voltage compensation.

Differential amplifiers typically have two inputs and are intended to amplify any difference of signal appearing between the two inputs. It is desirable that signals that are identical, with respect to both amplitude and time, and appear between the two terminals of the differential amplifier, not be amplified. However, it is not always possible to make corresponding parts of a differential amplifier electrically identical in all respects. Even if corresponding parts of a differential amplifier could be made to appear equal when first manufactured, such things as aging characteristics and/or temperature drift can cause the parts to exhibit different electrical parameters later on. This difference in electrical parameters can cause a common mode offset voltage. One solution to the problem, which has been proposed in the past, is to sample the differential output of the differential amplifier so that the bias currents can be adjusted accordingly to reduce the effects of the common mode offset. However, one of the shortcomings to such a solution is that when the bias currents are changed the gain of the differential amplifier also changes.

Accordingly, one of the objects of the present invention is to provide common mode offset compensation which does not affect the gain of the differential amplifier.

Another object of the present invention is to provide common mode offset compensation in a manner that permits controlling the bandwidth of the differential amplifier with a capacitor that is compatible with integrated circuit manufacturing processes.

SUMMARY OF THE INVENTION

In carrying out the above and other objects of the invention in one form, there is provided an improved differential amplifier having common mode offset compensation. One embodiment of the invention has means for sensing output common mode offset voltage from the differential amplifier and means for amplifying any common mode offset voltage that is sensed. Means are also provided for controlling voltage to the differential amplifier wherein the means for amplifying are coupled to the means for controlling the voltage so that the voltage to the differential amplifier can be adjusted either up or down as required, thereby changing the common mode offset voltage to an acceptable level.

The subject matter which is regarded as the present invention is set forth in the appended claims. The invention itself, however, together with further objects and advantages thereof, may be better understood by referring to the following detailed description taken in conjunction with the accompanying drawings.

Figure 1:
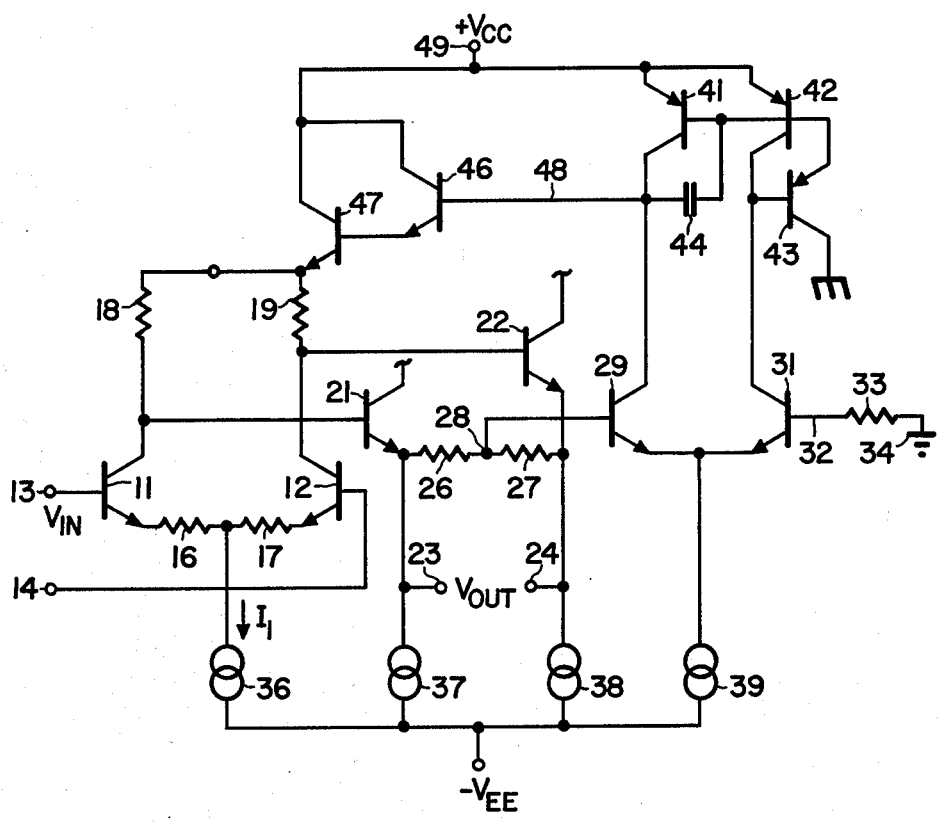
FIG. 1 illustrates in schematic form one embodiment of the invention.

The exemplifications set out herein illustrate the preferred embodiments of the invention in one form thereof, and such exemplifications are not to be construed as limiting in manner.

DESCRIPTION OF THE PREFERRED EMBODIMENT

In FIG. 1, transistors 11 and 12 serve as input transistors for a differential amplifier. The base of transistor 11 is connected to terminal 13 while the base of transistor 12 is connected to terminal 14. Terminals 13 and 14 are the input terminals to the differential amplifier. The emitters of transistors 11 and 12 are coupled to each other through series connected resistors 16 and 17. A current source 36 is connected to a junction formed by resistors 16 and 17. Current source 36 supplies a constant current for the differential amplifier. The collectors of transistors 11 and 12 are connected to an emitter of transistor 47 through resistors 18 and 19, respectively. Current 1 flowing through current source 36 is equally divided between transistors 11 and 12 when an identical input signal is supplied to terminals 13 and 14.

The collector of transistor 11 is also coupled to the base of transistor 21 while the collector of transistor 12 is coupled to the base of transistor 22. Transistors 21 and 22 serve as output transistors for the differential amplifier. The emitter of transistor 21 is connected to a current source 37 and to an output terminal 23. The emitter of transistor 22 is connected to a current source 38 and to an output terminal 24. The collectors of transistors 21 and 22 are connected to $V_{CC}$ terminal 49, however, this connection is not shown in order to avoid overcrowding the drawing. The output of the differential amplifier is taken from terminals 23 and 24. It is often desirable that the output common mode offset voltage of the differential amplifier which appears at terminals 23 and 24 be as near zero as is possible.

In order to achieve a low output common mode offset voltage, series connected resistors 26 and 27 are connected between the emitters of transistors 21 and 22. Resistors 26 and 27 are chosen so as to have equal resistances. If no common mode offset voltage exists, at terminals 23 and 24 then the voltage at node 28 is effectively zero volts. This is the condition when the voltage at terminals 23 and 24 are of equal magnitude but of opposite polarity. However, when a common mode offset voltage does exist at output terminals 23 and 24, that common mode offset voltage is sensed by resistors 26 and 27. This sensed voltage is present at junction 28 and coupled to the base of transistor 29. Transistor 29 along with transistors 31, 41, 42 and 43 form an amplifier to amplify any common mode offset voltage sensed by resistors 26 and 27. The emitters of transistors 29 and 31 are connected to a current source 39. As will be recognized by those persons skilled in the art, current source 39 is a constant current source. Base 32 of transistor 31 is coupled to a reference 34 by resistor 33, which has a resistance equal to the parallel resistance of resistors 26 and 27. Transistors 29 and 31 serve to amplify any difference in voltage occurring between junction 28 and base 32 of transistor 31. The collector of transistor 31 is connected to the base of transistor 43 and to the collector of transistor 42. The emitter of transistor 43 is connected to the base of transistor 42 and to the base of transistor 41. Transistors 41, 42 and 43 serve as loads for the amplifier formed by transistors 29 and 31. The emitters of transistors 41 and 42 are connected to a power source, $V_{CC}$, at terminal 49.

As transistor 29 senses a voltage at junction 28 its conduction is varied in accordance with the voltage sensed at junction 28. The change in conduction of transistor 29 is coupled to base 48 of transistor 46. Transistor 46 is connected to transistor 47 in a Darlington configuration. The collectors of transistor 46 and 47 are connected to terminal 49 while the emitter of transistor 47 is connected to the junction formed by resistors 18 and 19. Transistors 46 and 47 serve as a voltage source for the differential amplifier.

Current sources 36, 37, 38 and 39 can all be identical and of any configuration which is convenient. Of course, the current source can be biased to supply the required current. One such configuration could be an NPN transistor with its emitter coupled to a negative voltage source through a resistor. The base of the NPN transistor could then be connected to some suitable bias source.

As transistor 29 senses a non-zero voltage at junction 28 this voltage is reflected to base 48 of transistor 46 which, in turn, controls the voltage appearing at the junction formed by resistors 18 and 19. As an example, when the voltage at junction 28 is negative with respect to the voltage at base 32 then transistor 29 will conduct less, thereby causing transistor 31 to conduct more since the total current conduction through transistors 29 and 31 must equal the current supplied by constant current source 39. As the conduction of transistor 31 increases so does the conduction through transistor 42 which, in turn, causes transistor 43 to conduct more. The emitter of transistor 43 is connected to the base of transistor 41 thereby causing transistor 41 to conduct more and since transistor 29 is conducting less the excess in current is through base 48 which drives transistor 46 into heavier conduction. The increase in conduction of transistor 46 causes transistor 47 to conduct heavier, thereby increasing the voltage appearing at the junction formed by resistors 18 and 19. As this voltage increases in magnitude it is sensed by transistors 21 and 22 thereby causing the voltage at output terminals 23 and 24 to increase an equal amount. This increase in voltage is reflected to junction 28 thereby driving junction 28 in a positive direction. The voltage at junction 28 will increase until it equals the voltage appearing at base 32. Since base 32 is coupled to zero volt reference 34, junction 28 will increase to a zero volt level. It will be appreciated that instead of base 32 being coupled to a zero volt reference it could be coupled to any desirable reference source. As an example, it may be desirable to couple base 32 to some reference other than zero volt reference when both of the voltage sources supplying the circuit are not referenced to the same potential.

The overall loop is kept from oscillating by controlling the bandwidth of the loop. Capacitor 44 connected from the base to the collector of transistor 41 controls the bandwidth by making the unity gain crossover frequency of the overall loop very low. Since the impedance at the collector of transistor 41 is quite high, capacitor 41 can be of a value low enough to be compatible with integrated circuit manufacturing processes. Typically, capacitor 44 is in the order of five picofarads and, therefore, lends itself to being diffused on the same integrated circuit chip as the other components of the circuit.

By now, it should be appreciated that there has been provided a circuit to provide a low output common mode offset voltage. In addition, the circuit has a more predictable frequency response and is easier to compensate, particularly with a small capacitor which is compatible with integrated circuit manufacturing processes. In addition, the offset correction circuit does not effect the gain of the differential amplifier. This circuit is particularly useful in magnetic read amplifiers for purposes such as threshold detection.

Consequently, while in accordance with the Patent Statutes, there has been described, what at present are considered to be the preferred form of this invention, it will be obvious to those skilled in the art that numerous changes and modifications may be made herein without departing from the spirit and scope of the invention and it is, therefore, aimed in the following claims to cover all such modifications.

What is claimed as new and desired to secure by Letters Patents of the United States is:

1. An open loop common mode amplifier circuit, comprising: a differential amplifier having inputs, outputs and requiring a supply voltage; control means for changing the supply voltage to the differential amplifier, the control means being coupled to the differential amplifier; sensor means for sensing an output from the differential amplifier, the sensor means being coupled to outputs of the differential amplifier; and means for amplifying any common mode offset voltage which may exist on the output of the differential amplifier, the means for amplifying having an input and an output, the input being coupled to the sensor means, and the output of the means for amplifying being coupled to the control means to change the supply voltage to the differential amplifier to drive any common mode offset voltage which may exist to a minimum level.

2. The common mode amplifier circuit of claim 1 wherein the means for amplifying includes a differential amplifier having an input referenced to the predetermined level.

3. The common mode amplifier circuit of claim 1 wherein the means for amplifying further includes means for controlling bandwidth of the means for amplifying.

4. The common mode amplifier circuit of claim 3 wherein the means for controlling bandwidth is a capacitor coupled to the means for amplifying.

5. An open loop differential amplifier with output common mode offset voltage compensation, the differential amplifier requiring a power source voltage and having an output, comprising: means for sensing at the output of the differential amplifier any output common mode offset voltage from the differential amplifier; means for amplifying any common mode offset voltage sensed; and means for controlling the power source voltage to the differential amplifier, the means for amplifying being coupled to the means for controlling voltage so that the means for controlling responds to amplified common mode offset voltage sensed to change the power source voltage to the differential amplifier to drive the output common mode offset voltage to a minimum level.

6. The amplifier of claim 5 wherein the means for sensing includes two resistors connected in series across output terminals of the differential amplifier.

7. The amplifier of claim 6 wherein the means for amplifying includes a second differential amplifier having a first and second input, the first input being coupled to a junction formed by the two resistors and the second input being coupled to a reference to establish the predetermined level.

8. The amplifier of claim 7 wherein the means for amplifying further includes means for controlling bandwidth to reduce unity gain crossover frequency of the means for amplifying.

9. An integrated circuit having an open loop differential amplifier with differential input, the differential amplifier having a constant current source and requiring a supply voltage, comprising: a first and a second output amplifier each having a first and a second output terminal; a first and a second resistor connected in series from the first output terminal to the second output terminal; means to change the supply voltage to the differential amplifier, the means to change being coupled between the differential amplifier and the supply voltage; and a second differential amplifier having a first input connected to a junction of the series connected first and second resistors to amplify any output common offset voltage sensed at the output terminals, the second differential amplifier being coupled to the means to control, thereby changing the supply voltage to the differential amplifier to reduce the output common mode offset voltage.

10. A monolithic integrated circuit differential amplifier having a first and a second input, and a first and a second output, comprising: a first and a second transistor each having a base, collector, and emitter, the emitters being coupled together; a first constant current source coupled to the emitters of the first and second transistors; a third transistor having a base, collector and emitter, the emitter being coupled to the collectors of the first and second transistors, the collector of the third transistor being coupled to a power source terminal; a fourth transistor having a base, collector, and emitter, the base being coupled to the collector of the first transistor, the emitter of the fourth transistor being coupled to the first output; a fifth transistor having a base, collector, and emitter, the base being coupled to the collector of the second transistor, and the emitter of the fifth transistor being coupled to the second output; a first and a second resistor connected in series between the first and second output, the first and second resistors forming a junction therebetween; a sixth and seventh transistor each having a base, collector, and emitter, the emitters being coupled together, the base of the sixth transistor being coupled to the junction formed by the first and second resistors, the collector of the sixth transistor being coupled to the base of the third transistor, the base of the seventh transistor being coupled to a reference; and a second constant current source coupled to the emitters of the sixth and seventh transistors, the differential amplifier thereby having common mode offset voltage compensation.

* * * * *